(12) United States Patent
Kurashima

(10) Patent No.: US 10,712,098 B2
(45) Date of Patent: Jul. 14, 2020

(54) LOOP HEAT PIPE AND METHOD OF MANUFACTURING LOOP HEAT PIPE

(71) Applicant: SHINKO ELECTRIC INDUSTRIES CO., LTD., Nagano (JP)

(72) Inventor: Nobuyuki Kurashima, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 53 days.

(21) Appl. No.: 16/023,020

(22) Filed: Jun. 29, 2018

(65) Prior Publication Data

US 2019/0017749 A1    Jan. 17, 2019

(30) Foreign Application Priority Data

Jul. 12, 2017  (JP) .................................. 2017-136150

(51) Int. Cl.
| | |
|---|---|
| *F28D 15/02* | (2006.01) |
| *H01L 21/48* | (2006.01) |
| *F28D 15/04* | (2006.01) |
| *H01L 23/373* | (2006.01) |
| *H01L 23/427* | (2006.01) |

(52) U.S. Cl.
CPC ..... *F28D 15/0266* (2013.01); *F28D 15/0241* (2013.01); *F28D 15/0275* (2013.01);
(Continued)

(58) Field of Classification Search
CPC ........... F28D 2021/0028; F28D 15/043; F28D 15/046; F28D 2015/0216; F28D 15/02;
(Continued)

(56) References Cited

U.S. PATENT DOCUMENTS 3,602,429 A * 8/1971 Levedahl ............... B60H 1/025
                                                    237/9 R
3,782,449 A * 1/1974 Busse ................. F28D 15/0275
                                                    165/273
(Continued)

FOREIGN PATENT DOCUMENTS

| JP | 2011-027321 | 2/2011 |
|---|---|---|
| TW | M455152 U | 6/2013 |

(Continued)

OTHER PUBLICATIONS

Extended European search report dated Nov. 6, 2018 issued with respect to the corresponding European patent application No. 18182038.2.

*Primary Examiner* — Jianying C Atkisson
*Assistant Examiner* — Jose O Class-Quinones
(74) *Attorney, Agent, or Firm* — IPUSA, PLLC

(57) ABSTRACT

A loop heat pipe includes a first loop heat pipe including a first evaporator, a first condenser, a first liquid pipe, and a first vapor pipe forming a first loop together with the first liquid pipe, a second loop heat pipe including a second evaporator, a second condenser, a second liquid pipe, and a second vapor pipe forming a second loop together with the second liquid pipe, and a connecting part to connect the first condenser and the second evaporator. The first loop and the second loop are separate and independent from each other. The first loop heat pipe, the second loop heat pipe, and the connecting part are integrally formed by a metal.

12 Claims, 8 Drawing Sheets

(52) U.S. Cl.
CPC ........ *F28D 15/043* (2013.01); *H01L 21/4882* (2013.01); *H01L 23/3736* (2013.01); *H01L 23/427* (2013.01)

(58) Field of Classification Search
CPC .............. F28D 15/0233; F28D 15/025; F28D 15/0266; F28D 15/0275; F28D 15/0241; H01L 23/473; H01L 23/427; H01L 23/3735; H01L 23/3736; B23P 2700/09
USPC .......................... 165/104.21, 104.29, 104.33
See application file for complete search history.

(56) References Cited

U.S. PATENT DOCUMENTS

| | | | | |
|---|---|---|---|---|
| 5,647,429 | A * | 7/1997 | Oktay | F28D 15/0275 165/104.14 |
| 6,069,791 | A * | 5/2000 | Goto | G06F 1/203 165/104.33 |
| 6,843,308 | B1 * | 1/2005 | Duval | F28D 15/0233 165/104.26 |
| 2003/0051857 | A1 * | 3/2003 | Cluzet | B64G 1/503 165/41 |
| 2009/0101308 | A1 * | 4/2009 | Hardesty | F28D 1/035 165/80.4 |
| 2014/0246176 | A1 * | 9/2014 | Yang | F28F 13/00 165/104.26 |
| 2016/0259383 | A1 | 9/2016 | Shioga et al. | |

FOREIGN PATENT DOCUMENTS

| | | |
|---|---|---|
| TW | 201508236 | 3/2015 |
| WO | 2015/087451 | 6/2015 |

\* cited by examiner

FIG.2
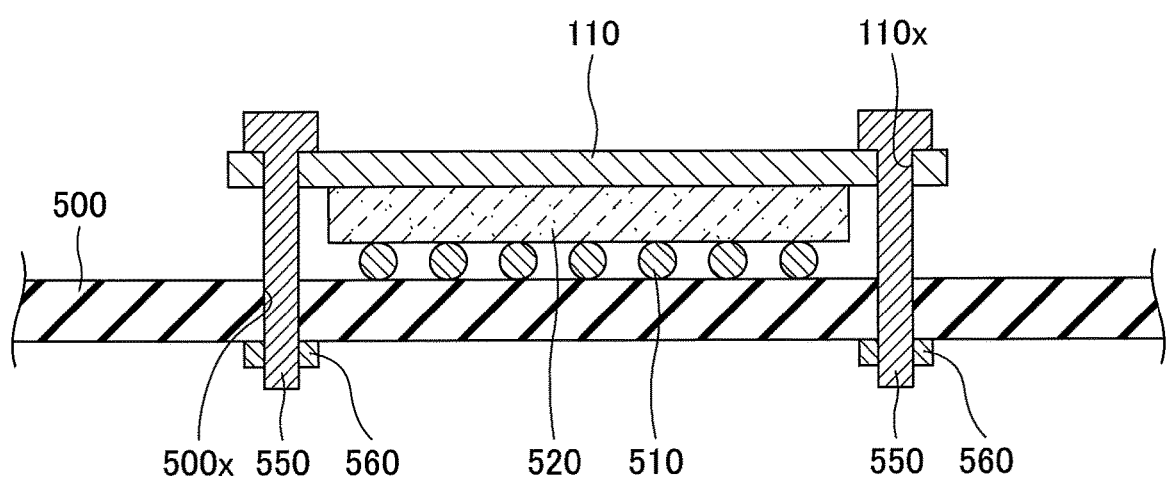
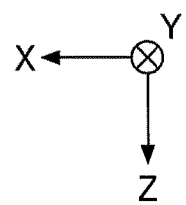

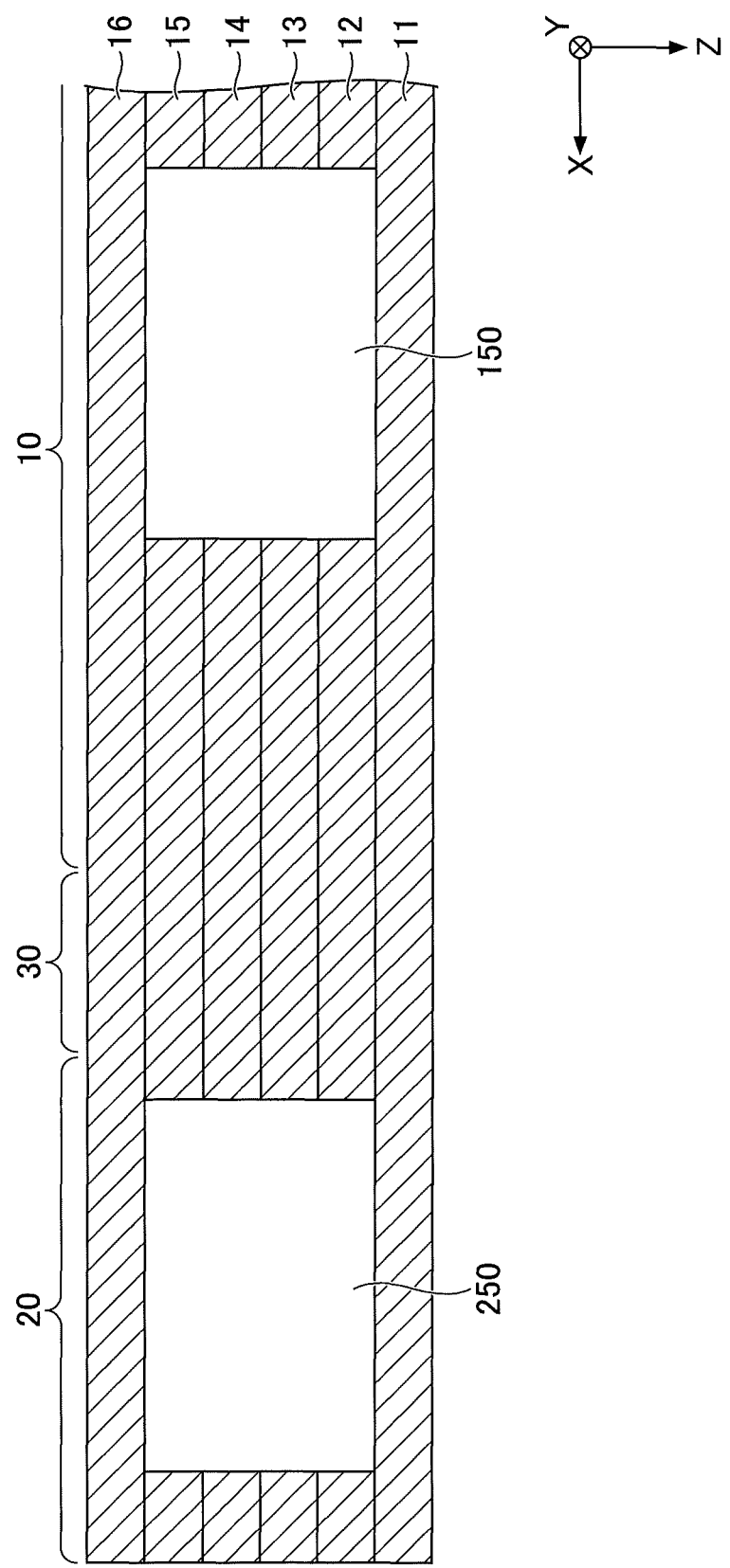

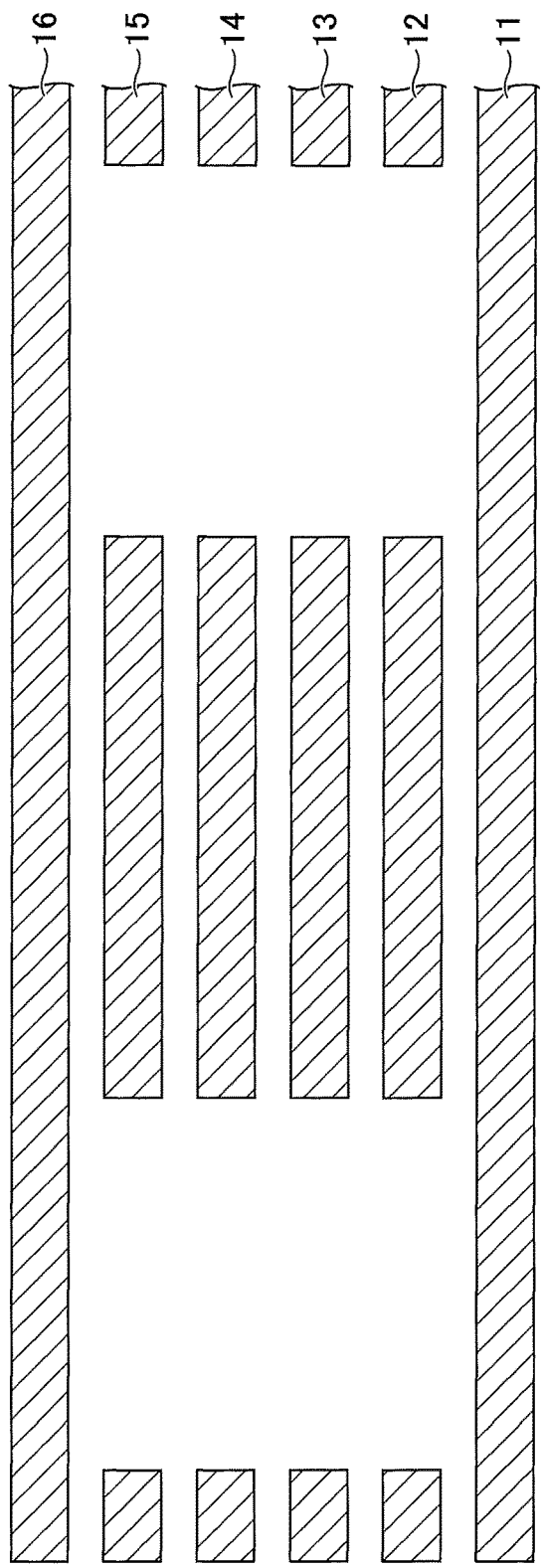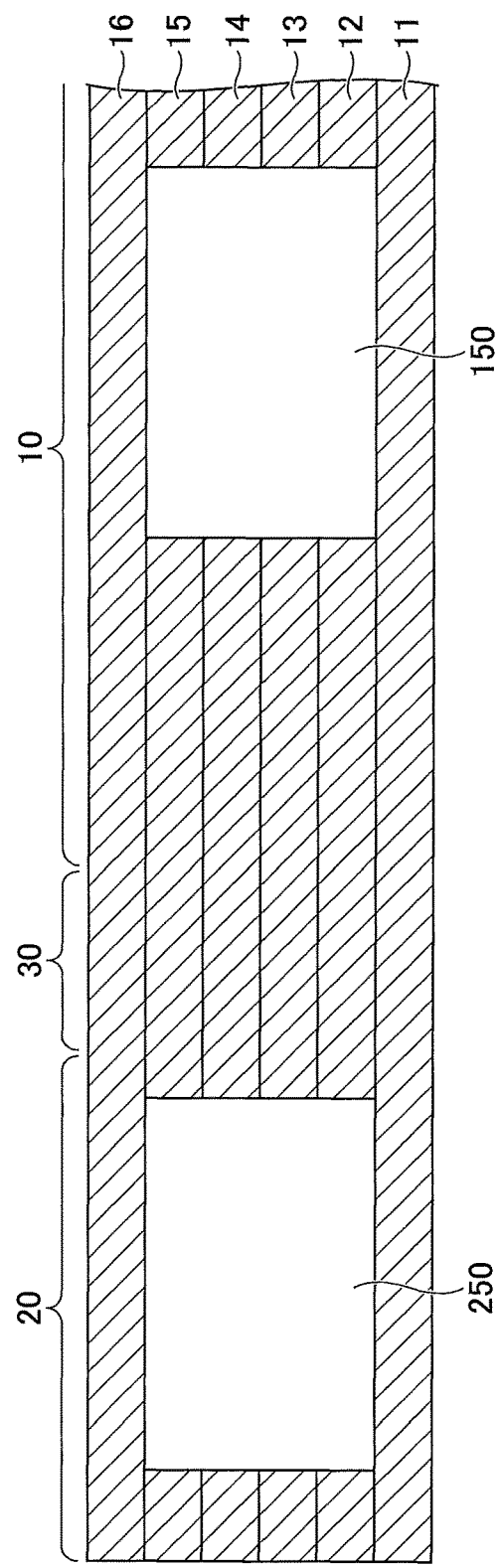

LOOP HEAT PIPE AND METHOD OF MANUFACTURING LOOP HEAT PIPE

CROSS-REFERENCE TO RELATED APPLICATION

This application is based upon and claims the benefit of priority of the prior Japanese Patent Application No. 2017-136150, filed on Jul. 12, 2017, the entire contents of which are incorporated herein by reference.

FIELD

Certain aspects of the embodiments discussed herein are related to a loop heat pipe and a method of manufacturing the loop heat pipe.

BACKGROUND

The heat pipe is a known device for cooling a heat generating component, such as a CPU (Central Processing Unit) or the like, mounted in an electronic apparatus. The heat pipe is a device that transfers heat by utilizing a phase change of a working fluid.

A loop heat pipe is an example of the heat pipe, and includes an evaporator that vaporizes the working fluid, and a condenser that liquefies the vaporized working fluid. The evaporator and the condenser are connected via a liquid pipe and a vapor pipe that form a loop-shaped passage (or channel). In the loop heat pipe, the working fluid flows through the loop-shaped passage in one direction. The evaporator and the condenser of the loop heat pipe are formed on the same plane, as described in International Publication No. WO2015/087451A1, for example.

However, in an actual product, a heat generating part and a heat sink part do not necessary exist on the same substrate (that is, on the same plane). When providing the loop heat pipe in the product in which the heat generating part and the heat sink do not exist on the same substrate, the vapor pipe and the liquid pipe need to be bent in order to mount the evaporator on the heat generating part and to mount the heat sink part on the condenser. However, when the hollow pipe is bent, an inner side of the pipe shrinks, while an outer side of the pipe stretches. For this reason, an inside of the bent part of the pipe becomes constricted and prevents a smooth flow of the working fluid, to make it difficult to transfer the heat from the heat generating part to the heat sink part.

SUMMARY

Accordingly, it is an object in one aspect of the embodiments to provide a loop heat pipe and a method of manufacturing the loop heat pipe, which can easily transfer the heat from the heat generating part to the heat sink part, even in a case in which the heat generating part and the heat sink part do not exist on the same plane.

According to one aspect of the embodiments, a loop heat pipe includes a first loop heat pipe including a first evaporator to vaporize a first working fluid into vapor, a first condenser to liquefy the vapor of the first working fluid, a first liquid pipe to connect the first evaporator and the first condenser, and a first vapor pipe to connect the first evaporator and the first condenser and to form a first loop together with the first liquid pipe, a second loop heat pipe including a second evaporator to vaporize a second working fluid into vapor, a second condenser to liquefy the vapor of the second working fluid, a second liquid pipe to connect the second evaporator and the second condenser, and a second vapor pipe to connect the second evaporator and the second condenser and to form a second loop together with the second liquid pipe, and a connecting part to connect the first condenser and the second evaporator, wherein the first loop and the second loop are separate and independent from each other, and wherein the first loop heat pipe, the second loop heat pipe, and the connecting part are integrally formed by a metal.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 2 is a cross sectional view of an evaporator and its periphery of the loop heat pipe in the first embodiment;

FIG. 3 is a cross sectional view along a line A-A in FIG. 1;

FIG. 4A and FIG. 4B are diagrams illustrating an example of manufacturing stages of the loop heat pipe in the first embodiment;

FIG. 5A and FIG. 5B are side views illustrating a state in which the loop heat pipe in the first embodiment is bent and mounted on a housing or the like;

DESCRIPTION OF EMBODIMENTS

Figure 1:
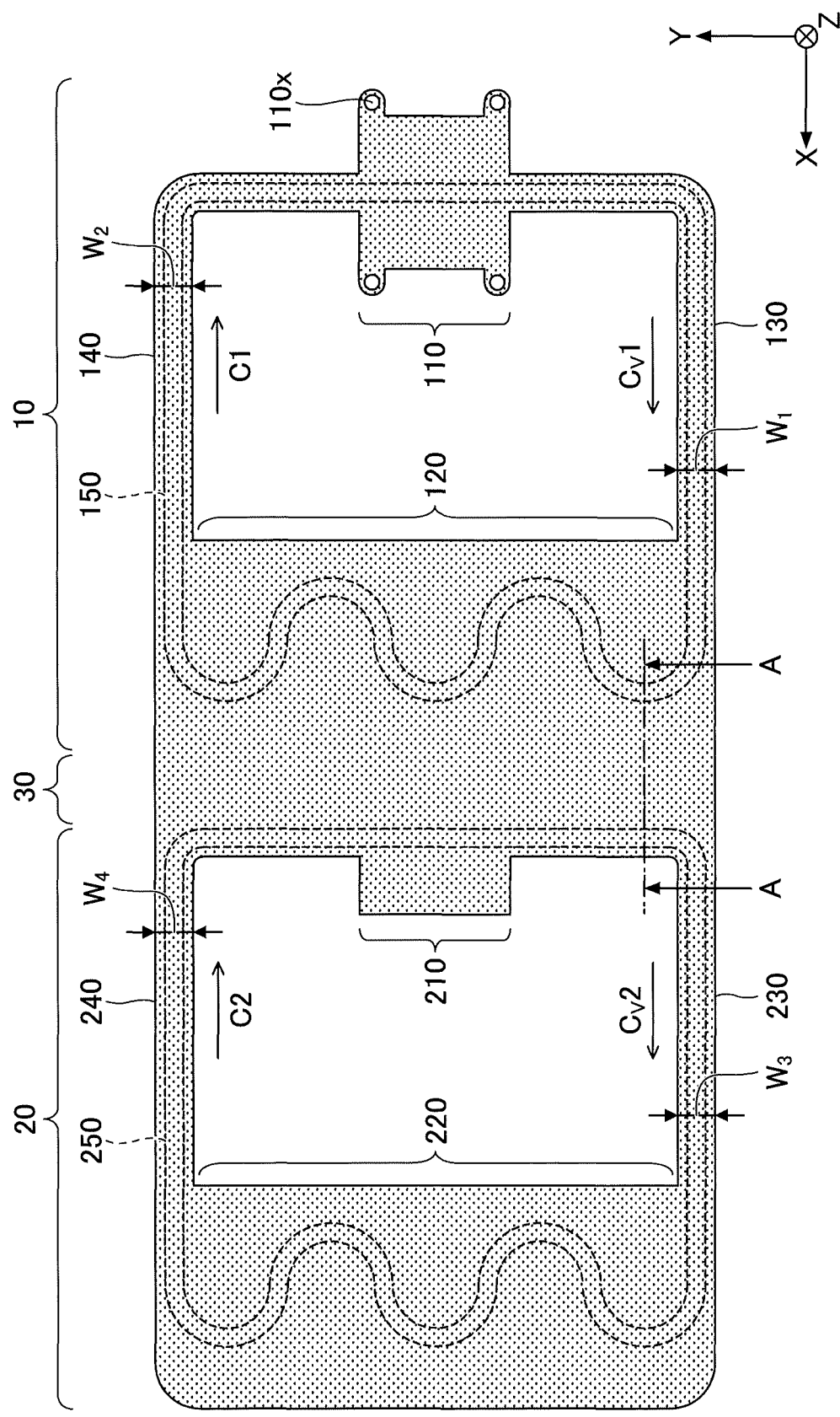
FIG. 1 is a schematic plan view illustrating an example of a loop heat pipe in a first embodiment.

Preferred embodiments of the present invention will be described with reference to the accompanying drawings. In the drawings, those parts that are the same are designated by the same reference numerals, and a repeated description of the same parts may be omitted.

A description will now be given of embodiments and modifications of the loop heat pipe and the method of manufacturing the loop heat pipe according to the present invention.

First Embodiment

[Structure of Loop Heat Pipe in First Embodiment]

First, a structure of the loop heat pipe in a first embodiment will be described. FIG. 1 is a schematic plan view illustrating an example of the loop heat pipe in the first embodiment.

As illustrated in FIG. 1, a loop heat pipe 1 includes a first loop heat pipe 10, a second loop heat pipe 20, and a connecting part 30.

The first loop heat pipe 10 includes an evaporator 110, a condenser 120, a vapor pipe 130, and a liquid pipe 140. In the first loop heat pipe 10, the evaporator 110 has a function to vaporize a working fluid C1 and generate vapor Cv1. The evaporator 110 accommodates therein a wick (not illustrated), for example. The wick is a porous sintered metal or sintered resin, and the working fluid C1 in a liquid phase preferably permeates the wick in a vicinity of the liquid pipe 140. Hence, a capillary force of the wick acts on the working fluid C1 in the liquid phase, and the capillary force counters the vapor Cv1 of the working fluid C1, to cause the working fluid C1 in the liquid phase to function as a backflow valve that prevents a backflow of the vapor Cv1 from the vapor pipe 130 to the liquid pipe 140.

The condenser 120 has a function to liquefy the vapor Cv1 of the working fluid C1. The evaporator 110 and the condenser 120 are connected via the vapor pipe 130 and the liquid pipe 140, and the vapor pipe 130 and the liquid pipe 140 form a loop-shaped passage (or channel) 150 in which the working liquid C1 or the vapor Cv1 flows. A width $W_1$ of the vapor pipe 130 may be approximately 8 mm, for example. In addition, a width $W_2$ of the liquid pipe 140 may be approximately 6 mm, for example.

FIG. 2 is a cross sectional view of an evaporator and its periphery of the loop heat pipe in the first embodiment. As illustrated in FIG. 1 and FIG. 2, the evaporator 110 includes four penetration holes 110x, for example. A bolt 440 is inserted into each penetration hole 110x of the evaporator 110 and a corresponding penetration hole 500x formed in a circuit board (or substrate) 500, and a tip of each bolt 550 is fastened by a nut 560 at a lower surface of the circuit board 500 in FIG. 2, to fix the evaporator 110 on the circuit board 500.

A heat generating component 520, which is an electronic component such as a CPU or the like, for example, is a heat generating part. The heat generating component 520 is mounted on the circuit board 500 via bumps 510. An upper surface of the heat generating component 520 makes contact with a lower surface of the evaporator 110. The working fluid C1 inside the evaporator 110 is vaporized by the heat generated from the heat generating component 520, to generate the vapor Cv1.

Returning now to the description of FIG. 1, the second loop heat pipe 20 includes an evaporator 210, a condenser 220, a vapor pipe 230, and a liquid pipe 240. In the second loop heat pipe 20, the evaporator 210 has a function to vaporize a working fluid C2 and generate vapor Cv2. The evaporator 210 accommodates therein a wick (not illustrated), for example. The wick is a porous sintered metal or sintered resin, and the working fluid C2 in a liquid phase preferably permeates the wick in a vicinity of the liquid pipe 240. Hence, a capillary force of the wick acts on the working fluid C2 in the liquid phase, and the capillary force counters the vapor Cv2 of the working fluid C1, to cause the working fluid C2 in the liquid phase to function as a backflow valve that prevents a backflow of the vapor Cv2 from the vapor pipe 230 to the liquid pipe 240.

The condenser 220 has a function to liquefy the vapor Cv2 of the working fluid C2. The evaporator 210 and the condenser 220 are connected via the vapor pipe 230 and the liquid pipe 240, and the vapor pipe 230 and the liquid pipe 240 form a loop-shaped passage (or channel) 250 in which the working liquid C2 or the vapor Cv2 flows. A width $W_3$ of the vapor pipe 230 may be approximately 8 mm, for example. In addition, a width $W_4$ of the liquid pipe 240 may be approximately 6 mm, for example.

The shape of the first loop heat pipe 10 and the shape of the second loop heat pipe 20 do not necessarily have to be the same.

The condenser 120 of the first loop heat pipe 10 and at least the evaporator 210 of the second loop heat pipe 20 are connected by the connecting part 30. In the example illustrated in FIG. 1, the evaporator 210, a part of the vapor pipe 230, a part of the liquid pipe 240, and the condenser 120 are connected by the connecting part 30.

The first loop heat pipe 10, the second loop heat pipe 20, and the connecting part 30 are integrally formed by a metal. Because the first loop heat pipe 10, the second loop heat pipe 20, and the connecting part 30 are integrally formed, a boundary between the condenser 120 of the first loop heat pipe 10 and the connecting part 30, and a boundary between the connecting part 30 and the evaporator 210 of the second loop heat pipe 20 do not need to be clearly distinguished.

In the first loop heat pipe 10, the working fluid C1 is not limited to a particular type of fluid. From a viewpoint of efficiently cooling the heat generating component 520 by latent heat of vaporization, a liquid with a high vapor pressure and a large latent heat of vaporization is preferably used as the working fluid C1. Examples of such a liquid, preferably used as the working fluid C1, include ammonia, water, fluorocarbon, alcohol, and acetone, for example.

The vapor Cv1 generated from the evaporator 110 passes through the vapor pipe 130 and is guided to the condenser 120, to be liquefied by the condenser 120. Hence, the heat generated from the heat generating component 520 is transferred to the condenser 120, to reduce a temperature rise of the heat generating component 520. The working fluid C1, liquefied by the condenser 120, passes through the liquid pipe 140 and is guided to the evaporator 110.

In the second loop heat pipe 20, the working fluid C2 is selected to a liquid with a saturated vapor pressure that is lower than that of the working fluid C1. The working fluid C2 is not limited to a particular type of fluid. In a case in which water is used as the working fluid C1, ethanol with a saturated vapor pressure lower than that of water, may be used as the working fluid C2.

The heat transferred to the condenser 120 of the first loop heat pipe 10 is transferred to the evaporator 210 of the second loop heat pipe 20, via the connecting part 30. Due to the heat transferred to the evaporator 210, the vapor Cv2 is generated from the working fluid C2 within the evaporator 210. The vapor Cv2 passes through the vapor pipe 230 and is guided to the condenser 220, to be liquefied by the condenser 220. A temperature T1 of the evaporator 110, a temperature T2 of the condenser 120, a temperature T3 of the evaporator 210, and a temperature T4 of the condenser 220 satisfy a relationship T1>T2>T3>T4.

In the example described above, the working fluid C2 is selected to the liquid with the saturated vapor pressure that is lower than that of the working fluid C1, in order to operate the second loop heat pipe 20. However, the working fluid C2 is not limited to such a liquid, and other methods may be used to operate the second loop heat pipe 20. For example, the same fluid or the same type of fluid may be used as the working fluid C1 and the working fluid C2, and a pressure reducing value within the passage 250 of the second loop heat pipe 20 may be set smaller than that within the passage 150 of the first loop heat pipe 10. In this case, it is also possible to operate the second loop heat pipe 20.

FIG. 3 is a cross sectional view along a line A-A in FIG. 1. As illustrated in FIG. 3, the evaporator 110, the condenser 120, the vapor pipe 130, and the liquid pipe 140 of the first loop heat pipe 10, the evaporator 210, the condenser 220, the vapor pipe 230, and the liquid pipe 240 of the second loop heat pipe 20, and the connecting part 30 form an integral structure that is formed by successively stacking six metal layers 11, 12, 13, 14, 15, and 16. However, the number of metal layers that are stacked is not limited to six, and the integral structure may be formed by stacking at least three or more metal layers.

The metal layers 11 through 16 are copper layers having a high thermal conductivity, for example, and the metal layers 11 through 16 are directly bonded to each other by solid-phase welding or the like. Each of the metal layers 11 through 16 has a thickness of approximately 50 μm to approximately 200 μm, for example. Of course, the metal layers 11 through 16 are not limited to the copper layers, and may be other metal layers including stainless steel layers, aluminum layers, magnesium alloy layers, or the like, for example.

The metal layers 11 and 16 are outermost metal layers located on both outer sides of a stacked structure that is formed by the metal layers 11 through 16, and form a part of outer walls of the passages 150 and 250. The metal layers 12 through 15 are intermediate metal layers that are sandwiched between the metal layers 11 and 16 that are the outermost metal layers. An intermediate layer structure is formed by the metal layers 12 through 15 in this example, however, the intermediate layer structure may be formed by at least one metal layer.

The passage 150 of the first loop heat pipe 10 and the passage 250 of the second loop heat pipe 20 are separate and independent from each other, and are not connected to each other. In other words, no hollow or cavity part, that may form a passage or the like, is formed in the connecting part 30.

[Method of Manufacturing Loop Heat Pipe in First Embodiment]

Next, a method of manufacturing the loop heat pipe in the first embodiment will be described. FIG. 4A and FIG. 4B are diagrams illustrating an example of manufacturing stages of the loop heat pipe in the first embodiment. FIG. 4A and FIG. 4B illustrate cross sections corresponding to the cross section illustrated in FIG. 3.

First, in the manufacturing stage illustrated in FIG. 4A, six metal sheets are prepared. Two of the six metal sheets are formed to the external shape illustrated in FIG. 1, to form the metal layers 11 and 16. In addition, the remaining four metal sheets are formed to the external shape illustrated in FIG. 1, and holes that become the passages 150 and 250 or the like are formed, to form the metal layers 12 through 15. The metal sheets may be formed by processes such as pressing, etching, or the like. In a case in which the material used for the metal sheet is copper, the etching may use a ferric chloride solution.

Next, in the manufacturing stage illustrated in FIG. 4B, the metal layers 11 through 16 are stacked. More particularly, the metal layers 11 and 16 form the outermost metal layers of the stacked structure. The metal layers 12 through 15, forming the intermediate metal layers, are stacked between the metal layers 11 and 16, forming the outermost metal layers. The stacked structure that is formed by the metal layers 11 through 16 is subjected to pressing, heating, and solid-phase welding. As a result, the adjacent metal layers are directly bonded to each other, to thereby complete the loop heat pipe 1 including the first loop heat pipe 10, the second loop heat pipe 20, and the connecting part 30. Thereafter, insides of the liquid pipes 140 and 240 are discharged (or purged) using a vacuum pump or the like, and then, the working fluid C1 is injected into the liquid pipe 140 through an injection opening (not illustrated), and the working fluid C2 is injected into the liquid pipe 240 through an injection opening (not illustrated). After injecting the working fluids C1 and C2, the respective injection openings are sealed.

The solid-phase welding refers to a method of bonding two parts, that are to be connected, in the solid-phase (or solid state), without melting the two parts. More particularly, the solid-phase welding heats the two parts in the solid-phase to soften the two parts, and further, applies pressure on the two parts to cause plastic deformation to bond the two parts to each other. In order to satisfactorily bond the adjacent metal layers to each other by the solid-phase welding, all of the metal layers 11 through 16 are preferably made of the same material.

The method of manufacturing the loop heat pipe 1 described above can form the structure before the loop heat pipe 1 is bent. The loop heat pipe 1 can thereafter be bent at an arbitrary angle at the connecting part 30, by applying a mechanical force on the structure. In other words, the first loop heat pipe 10 and the second loop heat pipe 20 can be bent relative to each other at the connecting part 30 of the loop heat pipe 1, so that the evaporator 110 and the condenser 220 are not positioned on the same plane. The bending may be performed at a timing immediately after the planar-shaped loop heat pipe 1 illustrated in FIG. 1 is formed, or at an arbitrary timing before the loop heat pipe 1 is used, such as before mounting the loop heat pipe 1 on the heat generating component 520, a housing, or the like.

Figure 5A:
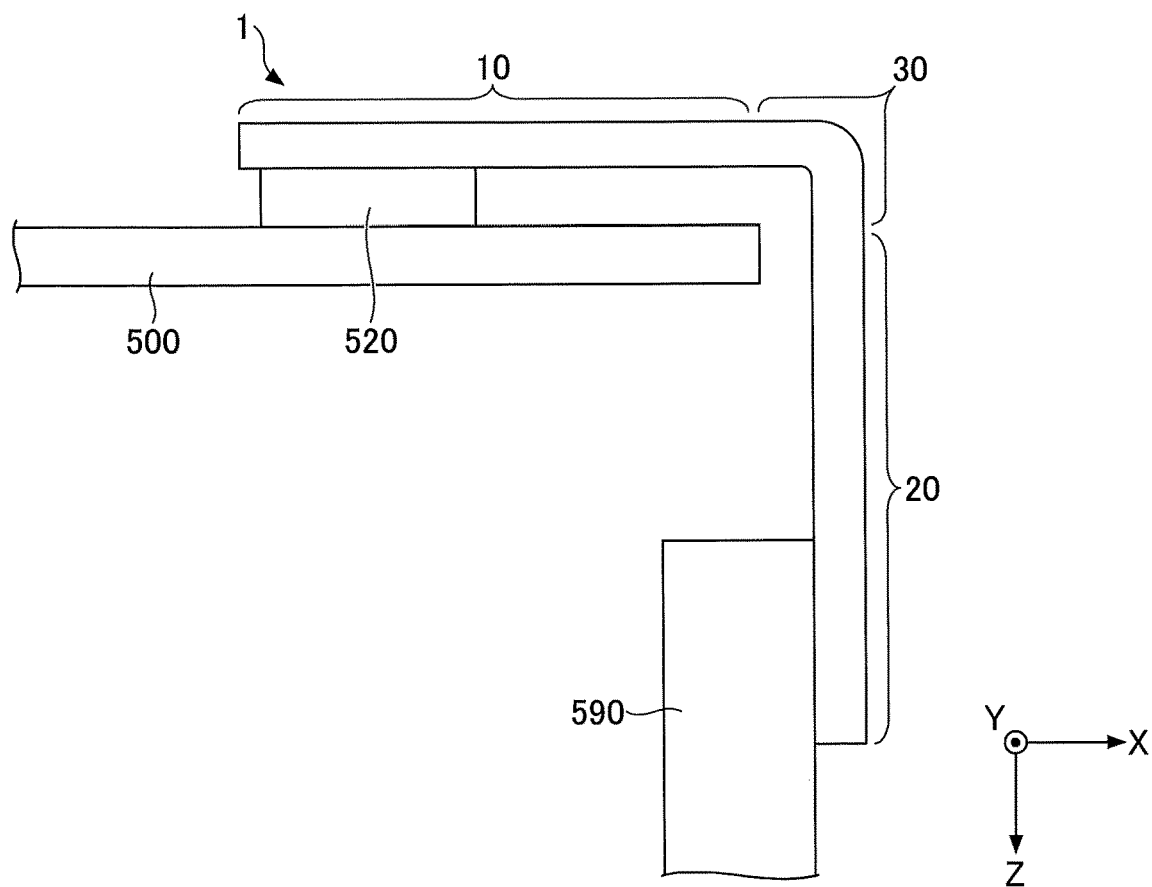
Figure 5B:
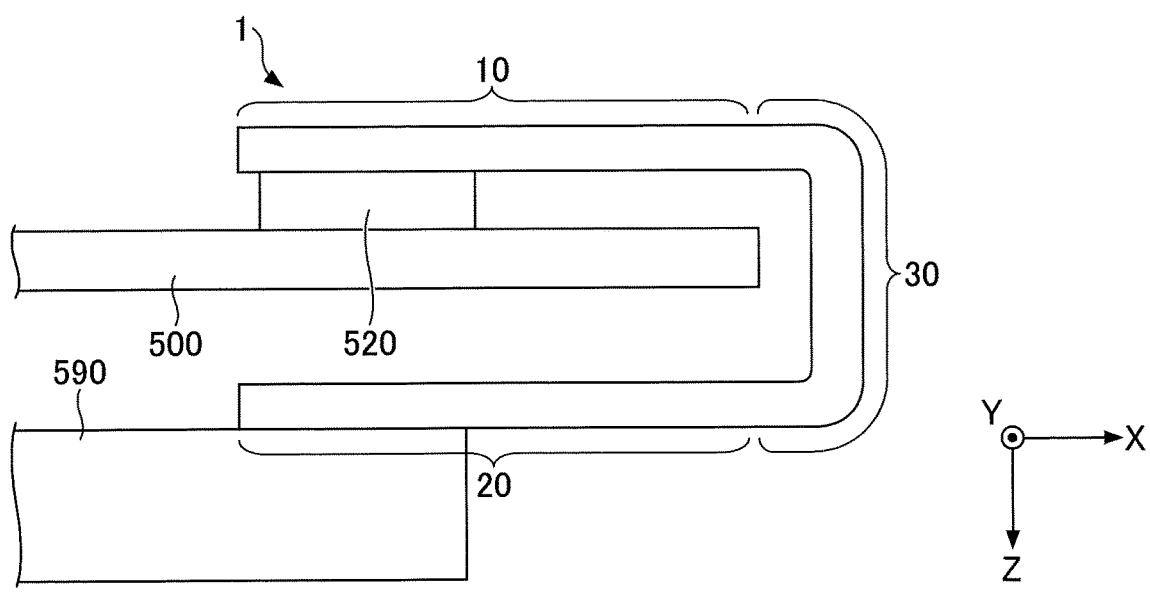

FIG. 5A and FIG. 5B are side views illustrating a state in which the loop heat pipe in the first embodiment is bent and mounted on the housing or the like, and illustration of detailed parts is omitted for the sake of convenience. FIG. 5A illustrates an example in which the loop heat pipe 1 is bent approximately 90 degrees at the connecting part 30. In FIG. 5A, the evaporator 110 of the first loop heat pipe 10 is mounted on the heat generating component 520 that is mounted on the circuit board 500. In addition, the condenser 220 of the second loop heat pipe 20 is mounted on a housing 590 that holds the circuit board 500. The housing 590 is a heat sink part that is made of a metal or the like.

FIG. 5B illustrates an example in which the loop heat pipe 1 is bent approximately 180 degrees at the connecting part 30. In FIG. 5B, the evaporator 110 of the first loop heat pipe 10 is mounted on the heat generating component 520 that is mounted on the circuit board 500, similarly to the example illustrated in FIG. 5A. In addition, the condenser 220 of the second loop heat pipe 20 is mounted on the housing 590 that holds the circuit board 500, similarly to the example illustrated in FIG. 5B.

Hence, the loop heat pipe 1 can be bent by an appropriate angle at the connecting part 30 connecting the first loop heat pipe 10 and the second loop heat pipe 20, according to an arrangement of the electronic component, such as the heat generating component 520, that becomes the heat generating part, and the housing 590 that becomes the heat sink part. Accordingly, in the product in which the heat generating part and the heat sink part do not exist on the same plane, it is possible to easily transfer the heat from the heat generating part to the heat sink part.

In addition, because the connecting part 30 does not include a hollow or cavity part that may form a passage or the like, the fluid flow will not be affected by the bending of the loop heat pipe 1 at the connecting part 30. Consequently, the transfer of heat will not be interfered by the bending of the loop heat pipe 1 at the connecting part 30. A width of the connecting part 30 along a X-direction in FIG. 1 may be arbitrarily set according to the bending angle at the connecting part 30. For example, when bending angle at the connecting part 30 is approximately 90 degrees as illustrated in FIG. 5A, the width of the connecting part 30 may be relatively narrow. When the bending angle at the connecting part 30 is approximately 180 degrees as illustrated in FIG. 5B, the width of the connecting part 30 needs to be relatively wide because the bending occurs at two locations. In addition, when the bending angle at the connecting part 30 is approximately 180 degrees as illustrated in FIG. 5B, the width of the connecting part 30 needs to be changed according to a distance of mutually opposing parts of the first loop heat pipe 10 and the second loop heat pipe 20.

The loop heat pipe 1 may be bent to shapes other than the shapes illustrated in FIG. 5A and FIG. 5B.

[First Through Third Modifications of First Embodiment]

In each of first through third modifications of the first embodiment, the shape of the connecting part is different from that of the first embodiment. In the first through third modifications of the first embodiment, those parts that are the same are designated by the same reference numerals, and a repeated description of the same parts may be omitted.

Figure 6:
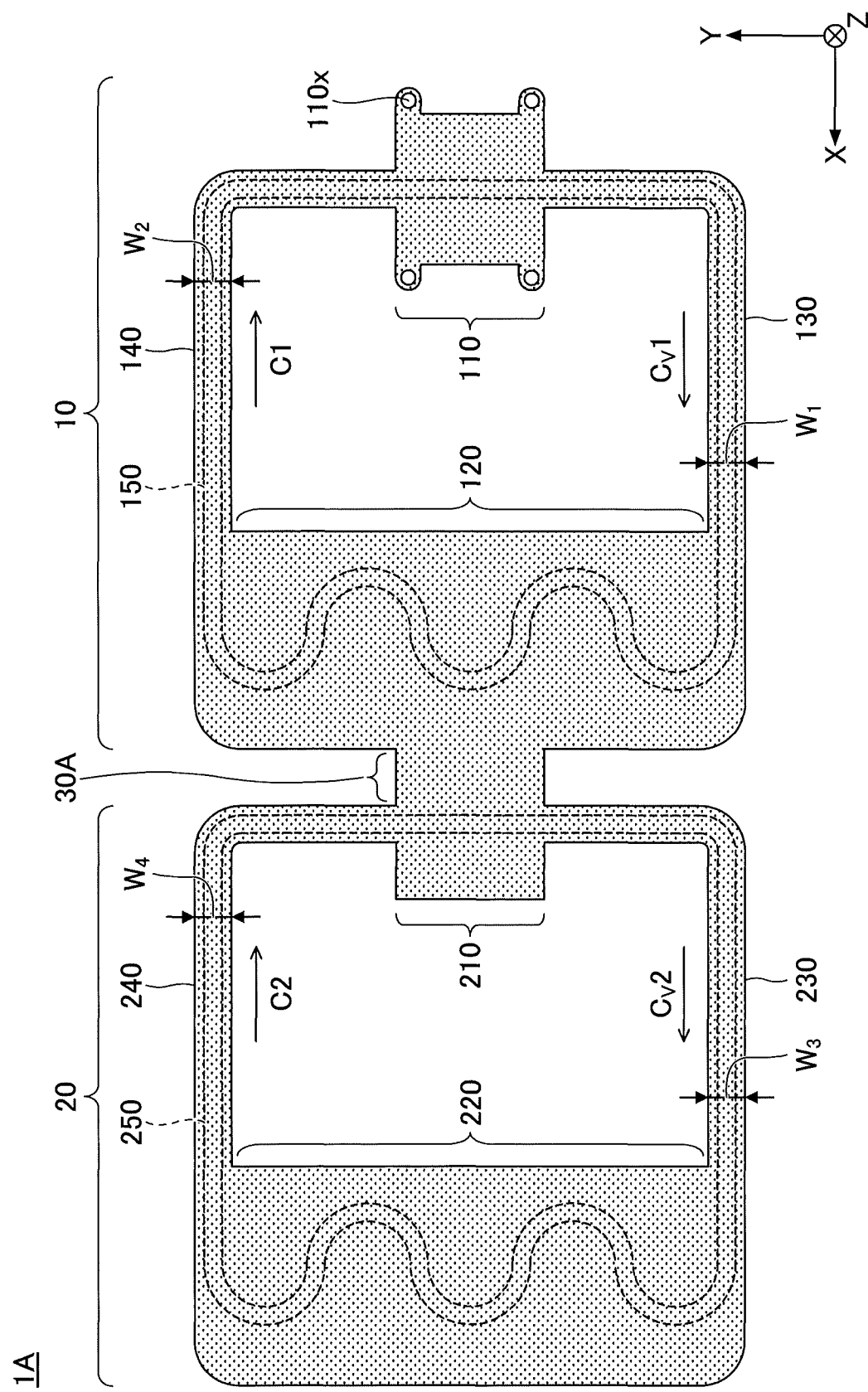
FIG. 6 is a schematic plan view illustrating an example of the loop heat pipe in a first modification of the first embodiment.

FIG. 6 is a schematic plan view illustrating an example of the loop heat pipe in the first modification of the first embodiment. A loop heat pipe 1A illustrated in FIG. 6 differs from the loop heat pipe 1 illustrated in FIG. 1, in that the connecting part 30 of the loop heat pipe 1 is replaced by a connecting part 30A.

A length of the connecting part 30 along a Y-direction in FIG. 1 is approximately the same as the lengths of the first loop heat pipe 10 and the second loop heat pipe 20. On the other hand, the length of the connecting part 30A along the Y-direction in FIG. 6 is shorter than the lengths of the first loop heat pipe 10 and the second loop heat pipe 20. In addition, the connecting part 30 connects a vicinity of a center part along the Y-direction of the condenser 120 of the first loop heat pipe 10, and the evaporator 210 of the second loop heat pipe 20.

In other words, the connecting part only needs to connect at least a part of the condenser 120 of the first loop heat pipe 10 and the evaporator 210 of the second loop heat pipe 20. Further, the length of the connecting part along the Y-direction may be appropriately determined by taking into consideration the strength, ease of bending, or the like of the entire loop heat pipe 1.

Figure 7:
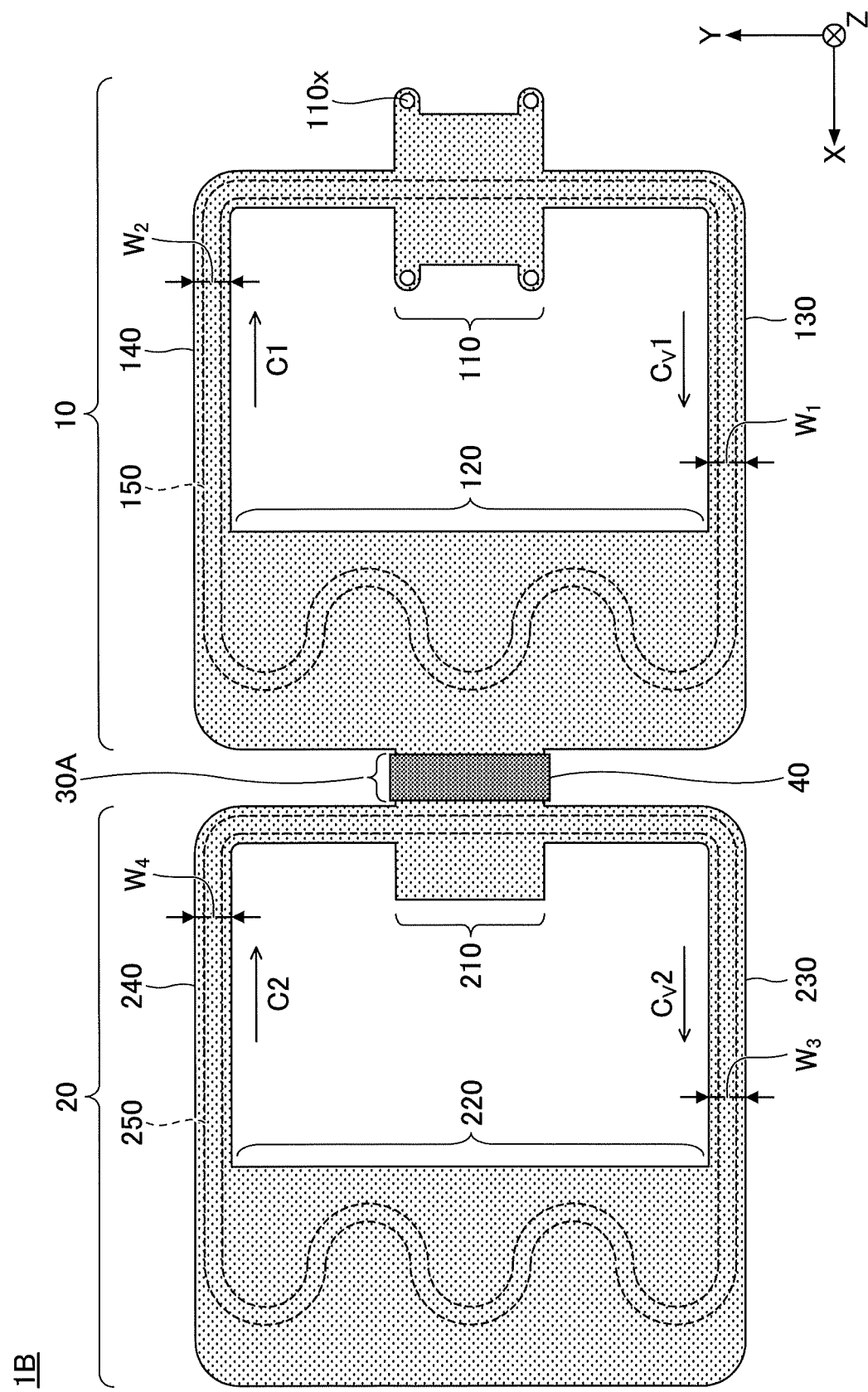
FIG. 7 is a schematic plan view illustrating an example of the loop heat pipe in a second modification of the first embodiment.

FIG. 7 is a schematic plan view illustrating an example of the loop heat pipe in the second modification of the first embodiment. A loop heat pipe 1B illustrated in FIG. 7 differs from the loop heat pipe 1A illustrated in FIG. 6, in that a thermal insulating member 40 is additionally provided.

The thermal insulating member 40 covers surfaces of the connecting part 30A. More particularly, the thermal insulating member 30 covers a top surface, a bottom surface, and a pair of side surfaces opposing each other along the Y-direction. For example, the thermal insulating member 40 is adhered on the surfaces of the connecting part 30A. The thermal insulating member 40 may be made of an appropriate material capable of reducing heat release from the connecting part 30A. For example, a metal material, such as aluminum or the like, may be used for the thermal insulating member 40. In addition, a foam material, such as urethane, polystyrene, or the like, may be used for the thermal insulating member 40. Further, a fiber material, such as glass wool, rock wool, or the like, may be used for the thermal insulating member 40.

In other words, by covering the surfaces of the connecting member by the thermal insulating member, it is possible to prevent heat release from the connecting part due to radiation. As a result, it is possible to reduce deterioration in the function of transferring the heat from the first loop heat pipe 10 to the second loop heat pipe 20.

The thermal insulating member may be provided at parts other than the connecting part. For example, the thermal insulating member may be provided to cover the entire surface of the first loop heat pipe 10 and the second loop heat pipe 20, excluding the evaporators 110 and 210 and the condensers 120 and 220.

Figure 8:
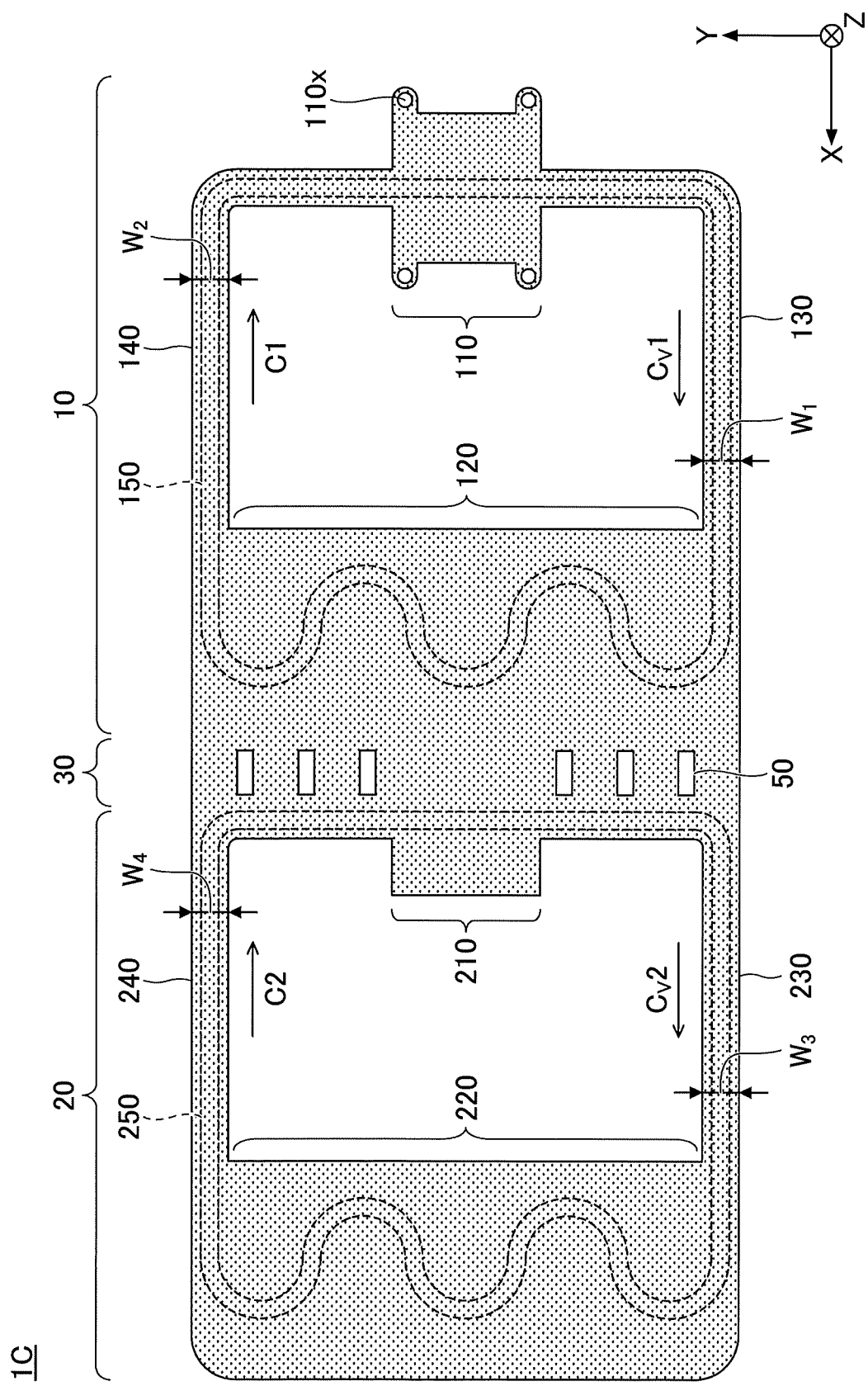
FIG. 8 is a schematic plan view illustrating an example of the loop heat pipe in a third modification of the first embodiment.

FIG. 8 is a schematic plan view illustrating an example of the loop heat pipe in the third modification of the first embodiment. A loop heat pipe 1C illustrated in FIG. 8 differs from the loop heat pipe 1 illustrated in FIG. 1, in that slits 50 are additionally provided.

The slits 50 are discretely provided in the connecting part 30, at parts excluding the center part of the connecting part 30 along the Y-direction. The center part of the connecting part 30 along the Y-direction makes contact with the evaporator 210. A planar shape of each slit 50 may be an arbitrary shape including a rectangular shape, a circular shape, an oval shape, a polygonal shape, or the like.

By providing the slits at predetermined positions of the connecting part, it is possible to increase the length of the connecting part along the Y-direction and secure a sufficient strength of the connecting part. In addition, it is possible to prevent the heat release from the connecting part due to radiation. As a result, it is possible to reduce deterioration in the function of transferring the heat from the first loop heat pipe 10 to the second loop heat pipe 20.

Although the embodiments and the modifications are numbered with, for example, "first," "second," or "third," the ordinal numbers do not imply priorities of the embodiments. Many other variations and modifications will be apparent to those skilled in the art.

For example, the embodiments and the modifications may be appropriately combined. As an example, the surfaces of the connecting part 30 may be covered by the thermal insulating member 40 in each of the loop heat pipe 1 illustrated in FIG. 1 and the loop heat pipe 1C illustrated in FIG. 8.

According to the embodiments and the modifications, it is possible to easily transfer the heat from the heat generating part to the heat sink part, even in a case in which the heat generating part and the heat sink part do not exist on the same plane.

Various aspects of the subject-matter described herein may be set out non-exhaustively in the following numbered clauses:

1. A method of manufacturing a loop heat pipe, comprising:

stacking a plurality of metal layers to form a first loop heat pipe, a second loop heat pipe, and a connecting part connecting the first and second loop heat pipes, wherein the first loop heat pipe includes a first evaporator configured to vaporize a first working fluid into vapor, a first condenser configured to liquefy the vapor of the first working fluid, a first liquid pipe configured to connect the first evaporator and the first condenser, and a first vapor pipe configured to connect the first evaporator and the first condenser, and to form a first loop together with the first liquid pipe, wherein the second loop heat pipe includes a second evaporator configured to vaporize a second working fluid into vapor, a second condenser configured to liquefy the vapor of the second working fluid, a second liquid pipe configured to connect the second evaporator and the second condenser, and a second vapor pipe configured to connect the second evaporator and the second condenser, and to form a second loop together with the second liquid pipe, wherein the first loop and the second loop are separate and independent from each other; and bonding the plurality of metal layers by solid-phase welding so that adjacent metal layers are directly bonded to each other, wherein the stacking includes forming a plurality of metal sheets into predetermined shapes to form the plurality of metal layers.

2. The method of manufacturing the loop heat pipe according to clause 1, further comprising:

bending the first loop heat pipe and the second loop heat pipe relative to each other at the connecting part, so that the first evaporator and the second condenser are not positioned on a single plane.

3. The method of manufacturing the loop heat pipe according to clause 1, wherein the stacking integrally forms the first loop heat pipe, the second loop heat pipe, and the connecting part by stacking the plurality of metal sheets.

4. The method of manufacturing the loop heat pipe according to clause 1, further comprising:

covering surfaces of the connecting part by a thermal insulating member.

5. The method of manufacturing the loop heat pipe according to clause 4, wherein the covering covers an entire surface of the first loop heat pipe and the second loop heat pipe by the thermal insulating member, excluding the first and second evaporators and the first and second condensers.

6. The method of manufacturing the loop heat pipe according to clause 1, further comprising:

forming a plurality of slits in the connecting part.

7. The method of manufacturing the loop heat pipe according to clause 6, wherein the forming discretely forms the plurality of slits in the connecting part, excluding a center part of the connecting part, and the center part of the connecting part makes contact with the second evaporator.

The description above use terms such as "determine", or the like to describe the embodiments, however, such terms are abstractions of the actual operations that are performed. Hence, the actual operations that correspond to such terms may vary depending on the implementation, as is obvious to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A loop heat pipe comprising:
a first loop heat pipe including
a first evaporator configured to vaporize a first working fluid into vapor,
a first condenser configured to liquefy the vapor of the first working fluid,
a first liquid pipe configured to connect the first evaporator and the first condenser, and
a first vapor pipe configured to connect the first evaporator and the first condenser, and to form a first loop together with the first liquid pipe;
a second loop heat pipe including
a second evaporator configured to vaporize a second working fluid into vapor,
a second condenser configured to liquefy the vapor of the second working fluid,
a second liquid pipe configured to connect the second evaporator and the second condenser, and
a second vapor pipe configured to connect the second evaporator and the second condenser, and to form a second loop together with the second liquid pipe; and
a connecting part, configured to connect the first condenser and the second evaporator, and including a plurality of slits,
wherein the first loop and the second loop are separate and independent from each other, and
wherein the first loop heat pipe, the second loop heat pipe, and the connecting part are integrally formed by a metal.

2. The loop heat pipe as claimed in claim 1, wherein the second working fluid is a liquid with a saturated vapor pressure that is lower than that of the first working fluid.

3. The loop heat pipe as claimed in claim 1, wherein
a same fluid is used as the first working fluid and the second working fluid, and
a pressure reducing value within the second loop is smaller than that within the first loop.

4. The loop heat pipe as claimed in claim 1, wherein the first loop heat pipe and the second loop heat pipe are bent relative to each other at the connecting part, so that the first evaporator and the second condenser are not positioned on a single plane.

5. The loop heat pipe as claimed in claim 1, further comprising:

a thermal insulating member covering surfaces of the connecting part.

6. The loop heat pipe as claimed in claim 5, wherein the thermal insulating member covers an entire surface of the first loop heat pipe and the second loop heat pipe, excluding the first and second evaporators and the first and second condensers.

7. The loop heat pipe as claimed in claim 1, wherein
the plurality of slits are discretely provided in the connecting part, excluding a center part of the connecting part, and
the center part of the connecting part makes contact with the second evaporator.

8. The loop heat pipe as claimed in claim 1, wherein
the first loop heat pipe, the second loop heat pipe, and the connecting part are formed by stacking a plurality of metal layers, and
the plurality of metal layers are all made of a same metal material.

9. The loop heat pipe as claimed in claim 1, wherein
the connecting part includes a non-hollow section having no hollow or cavity part, and
the first loop heat pipe and the second loop heat pipe are bent relative to each other at the non-hollow section of the connecting part.

10. The loop heat pipe as claimed in claim 9, wherein
the first loop heat pipe, bent at the non-hollow section of the connecting part, extends in a first direction, and the second loop heat pipe, bent at the non-hollow section of the connecting part, extends in a second direction intersecting the first direction.

11. The loop heat pipe as claimed in claim 10, wherein the first direction and the second direction form an angle of 90 degrees.

12. The loop heat pipe as claimed in claim 9, wherein the first loop heat pipe, bent at the non-hollow section of the connecting part, extends in a first direction, and the second loop heat pipe, bent at the non-hollow section of the connecting part, extends in a second direction parallel to the first direction.

* * * * *